(12) United States Patent
Shimanuki (10) Patent No.: US 7,170,114 B2
(45) Date of Patent: Jan. 30, 2007

(54) SEMICONDUCTOR DEVICE (75) Inventor: Takeshi Shimanuki, Yonezawa (JP)

(73) Assignee: Renesas Technology Corp., Tokyo (JP)

( * ) Notice: Subject to any disclaimer, the term of this patent is extended or adjusted under 35 U.S.C. 154(b) by 76 days.

(21) Appl. No.: 10/956,140

(22) Filed: Oct. 4, 2004

(65) Prior Publication Data

US 2005/0078540 A1  Apr. 14, 2005

(30) Foreign Application Priority Data

Oct. 9, 2003  (JP) .............................. 2003/350589

(51) Int. Cl.
*H01L 27/10* (2006.01)
*H01L 23/48* (2006.01)

(52) U.S. Cl. .................... 257/203; 257/207; 257/786; 257/E23.079; 257/E23.153

(58) Field of Classification Search ................ 257/203, 257/207, 208, 786, E23.079, E23.153
See application file for complete search history.

(56) References Cited

U.S. PATENT DOCUMENTS 5,235,207 A * 8/1993 Ohi et al. .................. 257/670
5,401,989 A * 3/1995 Kikuchi ..................... 257/211
6,339,234 B1 * 1/2002 Takizawa ................... 257/203

FOREIGN PATENT DOCUMENTS

JP  2002-043531  2/2002

* cited by examiner

*Primary Examiner*—Andy Huynh
*Assistant Examiner*—Dao H. Nguyen
(74) *Attorney, Agent, or Firm*—Miles & Stockbridge P.C.

(57) ABSTRACT

A chip size is remarkably reduced by providing effective layout of the I/O buffers. Since a large capacity non-volatile memory is arranged, bonding pads are arranged at the area near each side of the rectangular shape semiconductor chip and the I/O buffers are arranged in the side of the internal circuit area of these bonding pads. In this semiconductor chip, the number of I/O buffers in the side of the longer sides is larger than that in the side of the shorter sides of the semiconductor chip. For example, the n I/O buffers are arranged respectively in the side of two longer sides, while (n−2) I/O buffers are arranged respectively in the side of two shorter sides. Accordingly, the I/O buffers can be arranged without unnecessary increase in the chip area.

27 Claims, 12 Drawing Sheets

SEMICONDUCTOR DEVICE

CROSS-REFERENCE TO RELATED APPLICATION

The present application claims priority from Japanese patent application No. 2003-350589 filed on Oct. 09, 2003, the content of which is hereby incorporated by reference into this application.

BACKGROUND OF THE INVENTION

The present invention relates to a layout technology for semiconductor devices and particularly to the technology which can be adapted effectively for a semiconductor device including a nonvolatile memory.

In these years, a semiconductor device tends to load a non-volatile memory such as a large capacity flash memory with rapid progress in high integration density and function of a single chip semiconductor device.

For example, a microcomputer for keyboard control comprises a non-volatile memory in the capacity of about 1 MB in order to store the system BIOS (Basic Input/Output System).

Such large capacity non-volatile memory occupies about 50% or more of the chip layout area, and therefore, when it is required to layout such memory into a semiconductor chip, such non-volatile memories are combined into the limited chip area to realize efficient arrangement thereof.

Moreover, a layout design data is introduced into a certain stacked package. Namely, in view of saving time and labor required for design and development in the type of devices if a change is newly generated in development in a type of chip, an input/output circuit unit and a pad of one chip among two chips to be loaded into a stacked package are separated from each other, and the input/output circuit unit is included within the circuit having the intrinsic specifications of the chips. (For example, refer to the Patent Document 1.)

[Patent Document 1]

Japanese Unexamined Patent Publication No. 2002-43531.

SUMMARY OF THE INVENTION

An object of the present invention is to provide a semiconductor device which can be reduced remarkably in the chip size and also provide a layout method thereof.

The abovementioned object, the other objects and novel features of the present invention will become apparent from the detail description of the specification and the accompanying drawing thereof.

The summary of the typical inventions of the present invention disclosed in this application will be described briefly as follows.

The semiconductor device of the present invention is provided with a rectangular semiconductor chip. This semiconductor chip comprises: a plurality of electrodes arranged along four sides of the semiconductor chip; and a plurality of I/O buffers arranged along the four sides of the semiconductor chip in the internal side of the plurality of electrodes. The number of I/O buffers arranged along the longer sides of the semiconductor chip is set larger than the number of I/O buffers arranged along the shorter sides of the semiconductor chip.

The other summaries of the present invention will be described briefly.

A layout method of the semiconductor device of the present invention comprises the steps of: arranging a plurality of electrodes along the four sides of the semiconductor chip in the periphery thereof; and arranging a plurality of I/O buffers along the four sides of the semiconductor chip at the internal side of the electrodes. The number of I/O buffers arranged along the longer sides of the semiconductor chip is set larger than the number of I/O buffers arranged along the shorter sides of the semiconductor chip.

The effects of the typical inventions of the present invention disclosed in this specification will be briefly described below.

A chip size of the semiconductor device can be reduced.

Moreover, manufacturing cost of the semiconductor can be remarkably lowered.

In addition, reliability of semiconductor device can be improved.

DETAILED DESCRIPTION OF THE PREFERRED EMBODIMENTS

The preferred embodiments of the present invention will be described with reference to the accompanying drawings. The like members will be designated with the like reference numerals throughout the drawings in this specification and the repetitive description will be eliminated.

The inventors of the present invention have found the following problems in the layout technology of semiconductor device disclosed by the prior art.

Namely, a non-volatile memory increases in the X (row) decoder size in proportional to memory capacity and particularly becomes longer in the longer side direction. The reason is that since an address area of memory is expanded, the number of address buses and word lines in the X decoder side increases. Meanwhile, the Y (column) decoder side is used for input/output of data bus and therefore it does not change in size when the number of bits does not change. Accordingly, when memory capacity of non-volatile memory is expanded, the semiconductor chip changes into a rectangular shape.

In the semiconductor chip of such rectangular shape, it becomes difficult from the viewpoint of space to layout, in the area near the external circumference in the shorter side of the semiconductor chip, the I/O buffers in the same number as that arranged in the area near the external circumference of the longer side. As a result, a problem rises, in which this semiconductor chip cannot be sealed into the square packages such as TQFP (Thin Quad Flat Package) and BGA (Ball Grid Array) Moreover, when the shorter side of the semiconductor chip is elongated, the I/O buffers can be laid in the same number as the I/O buffers arranged in the area near the external circumference of the longer side. However, the semiconductor chip becomes unnecessarily larger and it is a demerit for miniaturization. Further, a new problem also rises, in which the manufacturing cost increases.

(First Embodiment)

Figure 1:
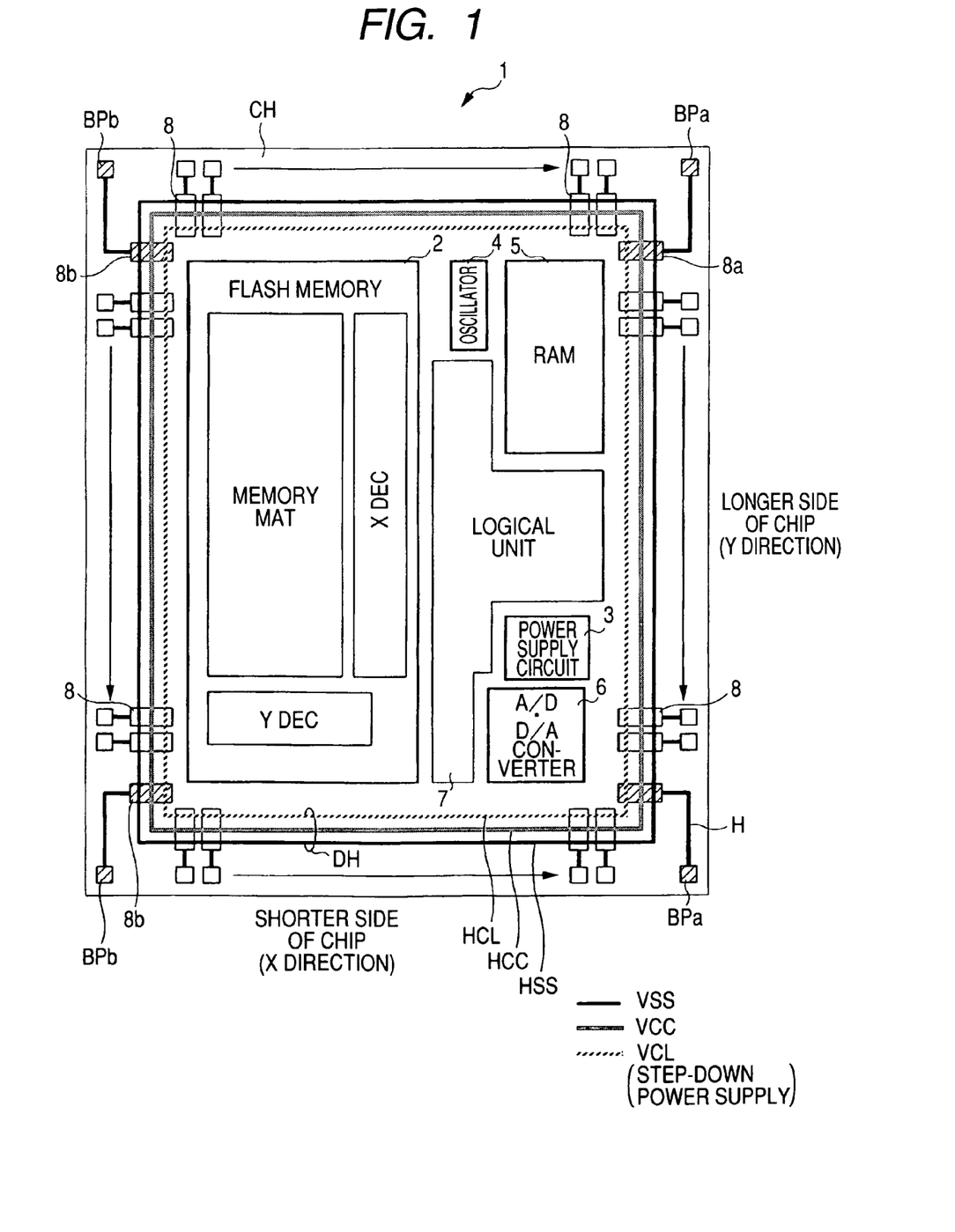
FIG. 1 is an explanatory diagram of a semiconductor chip layout of the semiconductor device of the preferred embodiment of the present invention.
Figure 2:
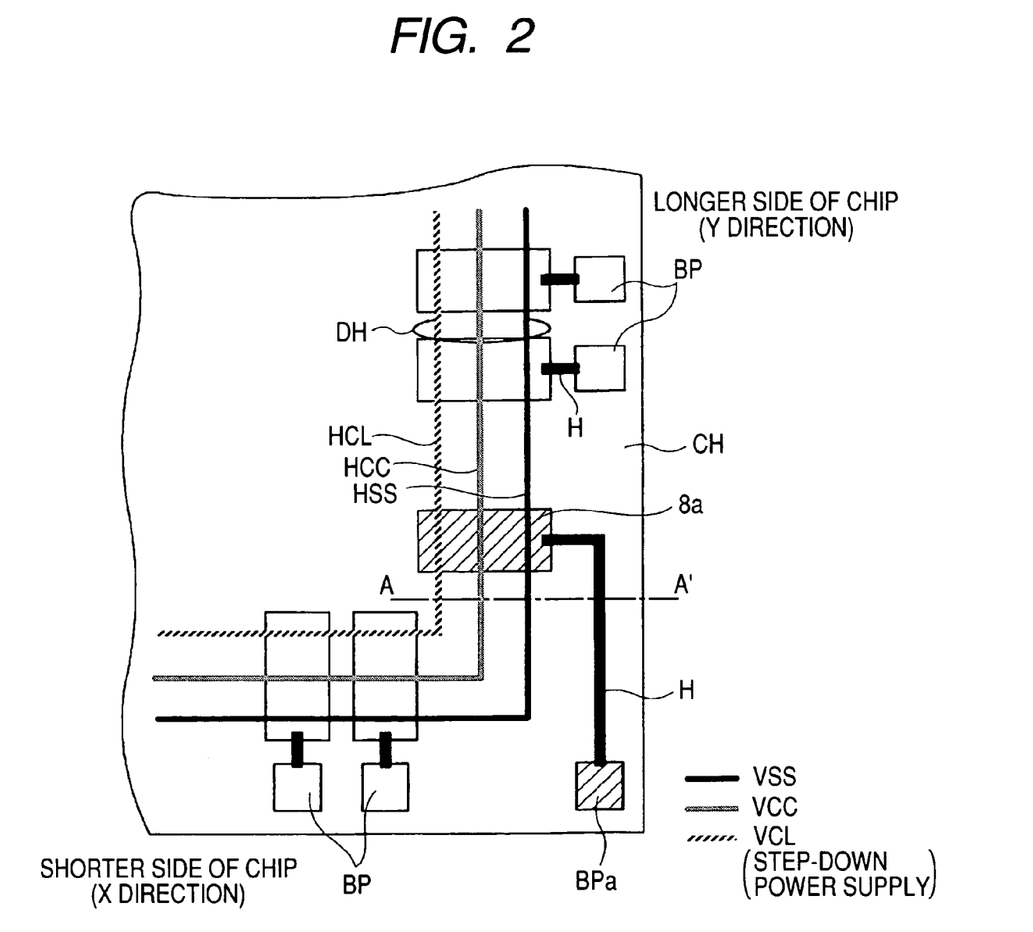
FIG. 2 is an enlarge explanatory diagram of the area near the corner in the semiconductor chip of FIG. 1.
Figure 3:
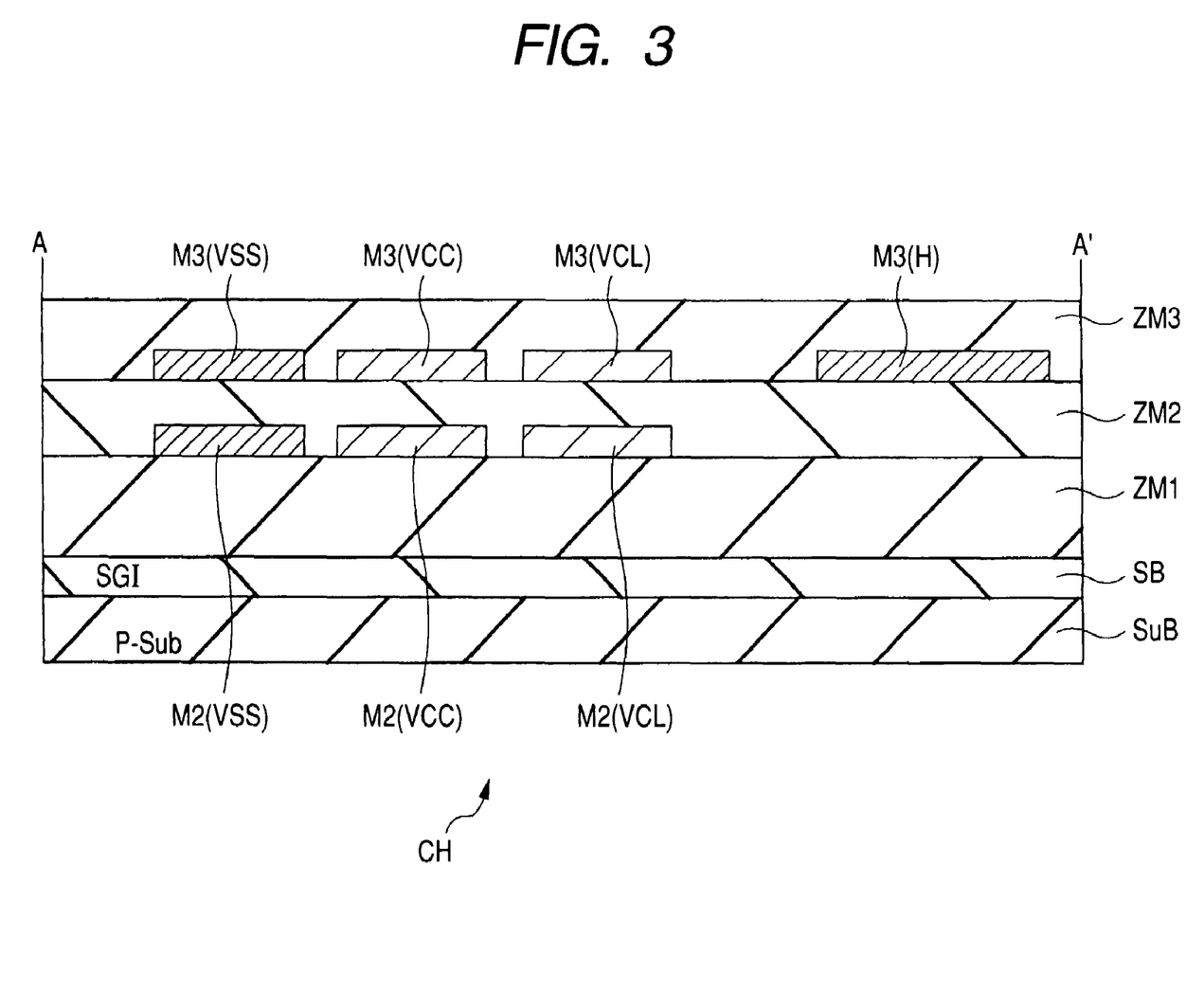
FIG. 3 is a cross-sectional view illustrating the wiring structure of the power supply wirings in the semiconductor chip of FIG. 1.
Figure 4:
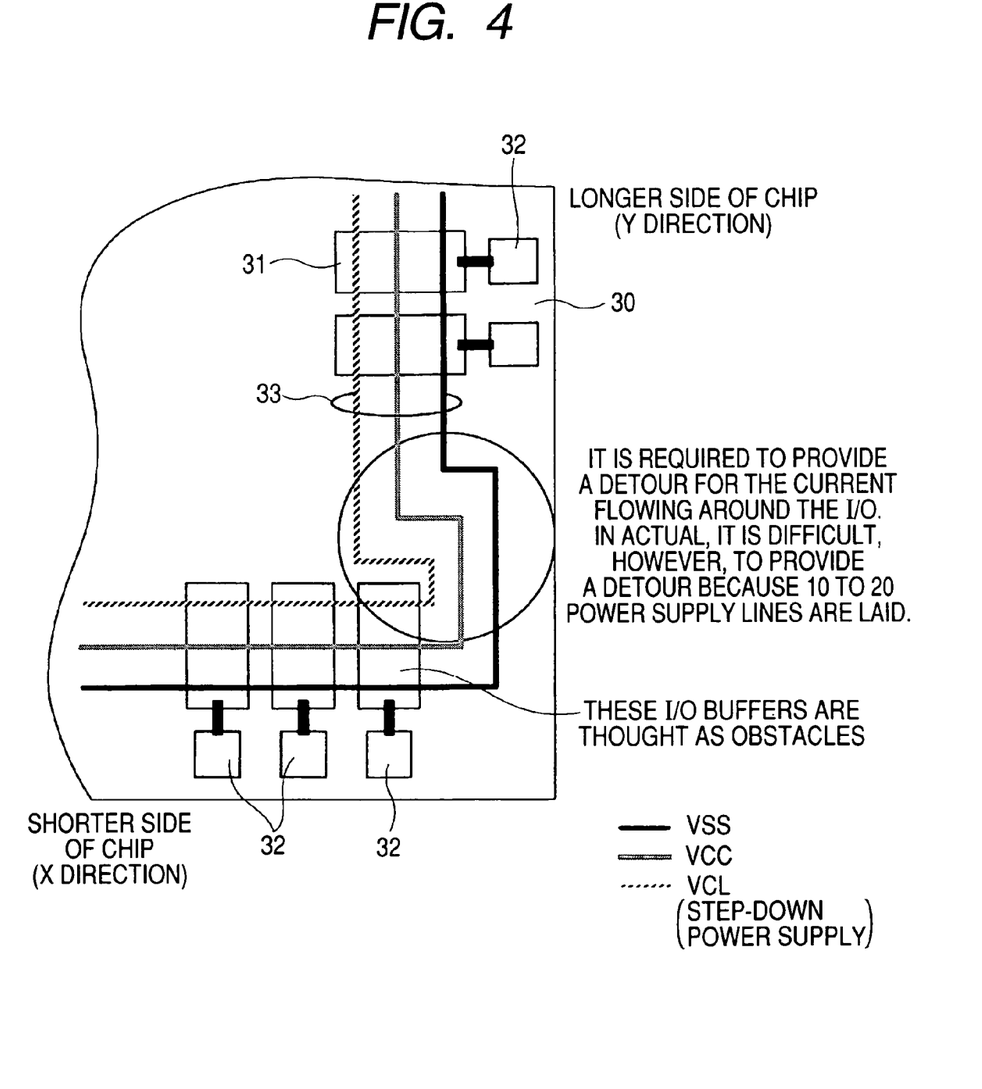
FIG. 4 is an explanatory diagram illustrating an example of layout of I/O buffers and bonding pads in the semiconductor chip discussed by the inventors of the present invention.
Figure 5:
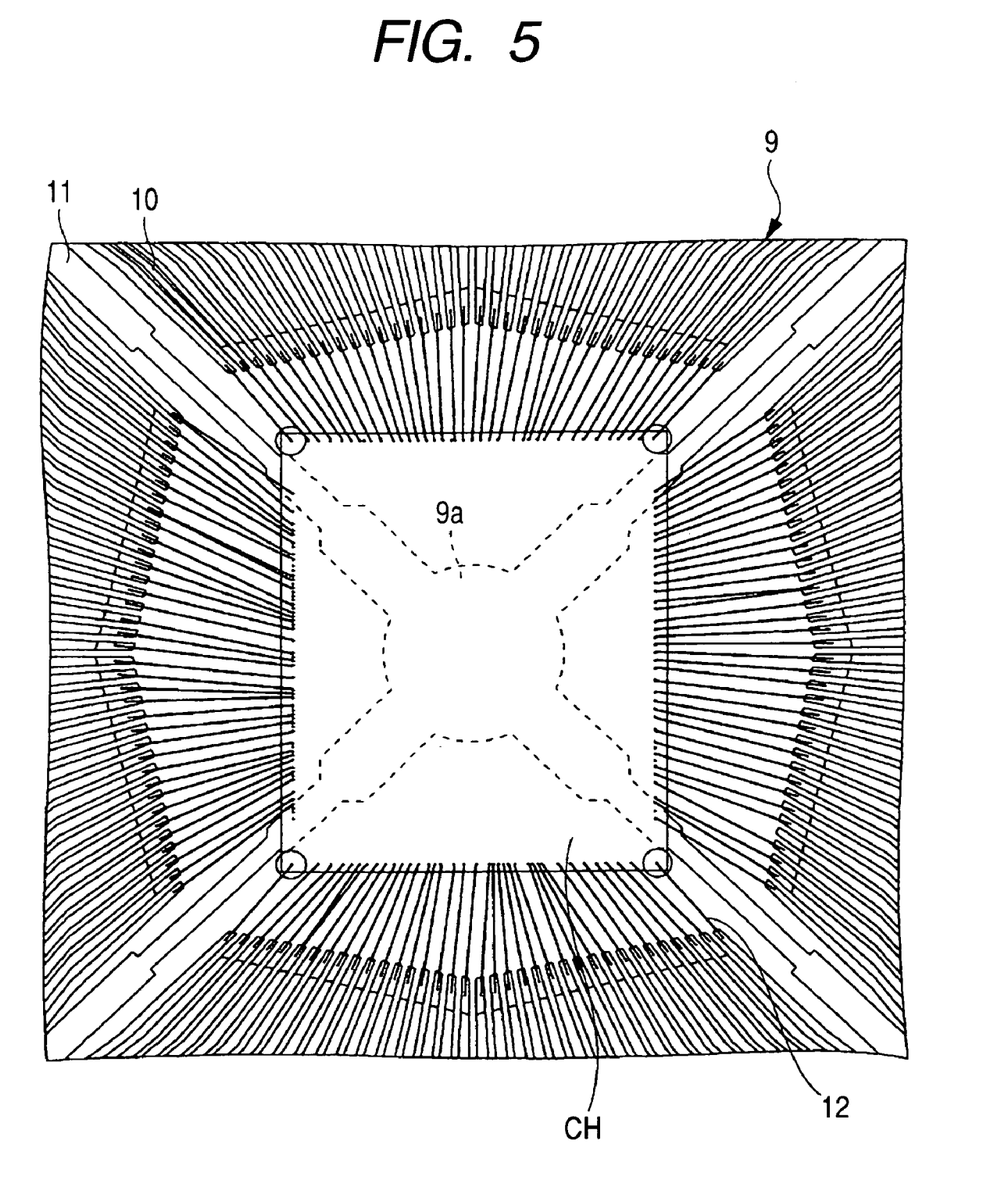
FIG. 5 is an explanatory diagram illustrating a wiring example of bonding wires in the semiconductor chip of FIG. 1.
Figure 6A:
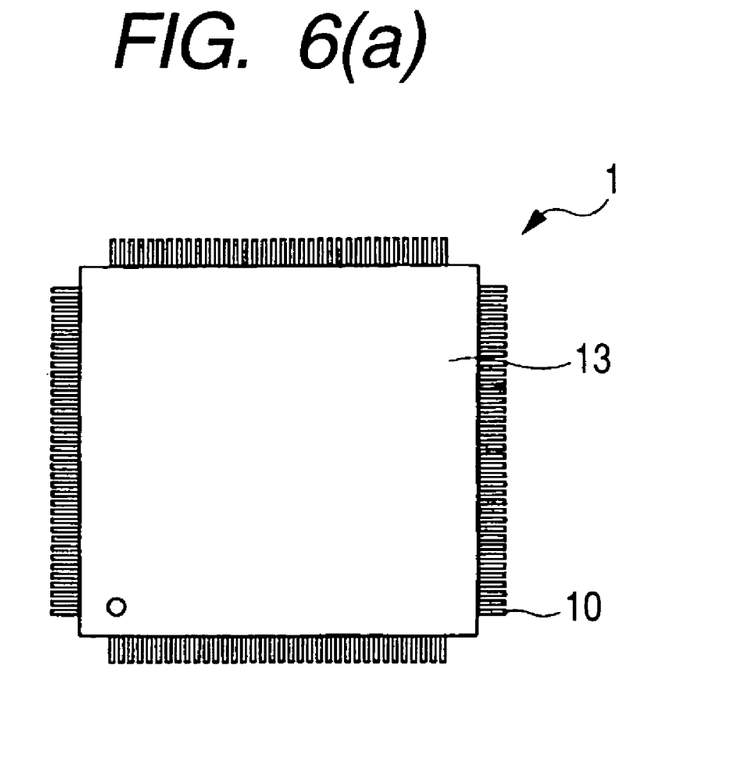
FIGS. 6A and 6B are external diagrams illustrating an example of the semiconductor device formed by using the semiconductor chip of FIG. 1.
Figure 6B:
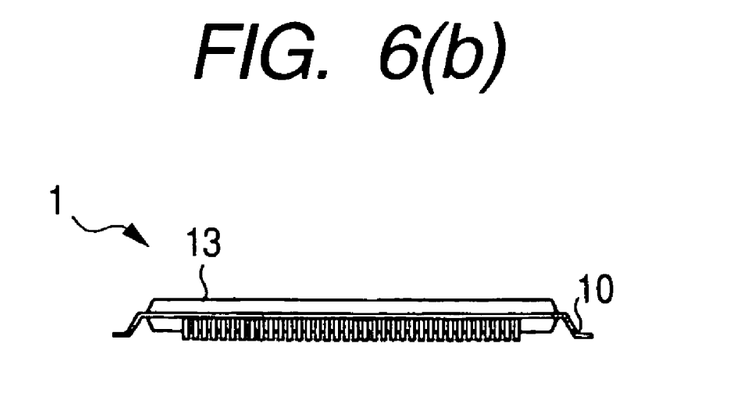

FIG. 1 is an explanatory diagram of a semiconductor chip layout of a semiconductor device in the first embodiment of the present invention. FIG. 2 is an enlarged explanatory diagram of the area near the corner in the semiconductor chip CH of FIG. 1. FIG. 3 is a cross-sectional view illustrating a wiring structure of the power supply wires in the semiconductor chip CH of FIG. 1. FIG. 4 is an explanatory diagram illustrating a layout example of the I/O buffers and bonding pads in the semiconductor chip CH discussed by the inventors of the present invention. FIG. 5 is an explanatory diagram illustrating an example of wiring of bonding wires in the semiconductor chip CH of FIG. 1. FIGS. 6A and 6B are external diagrams illustrating an example of the semiconductor device formed by using the semiconductor chip CH of FIG. 1.

In this embodiment, the semiconductor device 1 is formed of a single chip microcomputer and is sealed into a rectangular shape package such as TQFP and TFBGA (Thin Film BGA).

The semiconductor device 1 comprises a non-volatile memory (non-volatile memory module) 2, a power supply circuit 3, an oscillator 4, a RAM 5, an A/D (Analog/Digital) •D/A (Digital/Analog) converter 6, and an I/O buffer 8. As illustrated in FIG. 1, these members are arranged on the semiconductor chip CH in the predetermined layout. Here, the semiconductor chip CH is formed in the shape having four sides including the relatively longer sides extending in the Y direction of FIG. 1 and the relatively shorter sides extending in the X direction of FIG. 1. In this first embodiment, the semiconductor chip CH is formed in such rectangular shape.

Moreover, the I/O buffer 8 is formed, for example, of an output buffer including an ESD protection circuit, an input circuit, a level shift circuit, and an input/output control circuit or the like.

Within an internal circuit area of the semiconductor chip CH, the non-volatile memory 2 is provided in the left side of the semiconductor chip CH. This non-volatile memory 2 is formed, for example, of a large capacity flash memory and has the capacity of 1 Mbytes in this first embodiment.

With further improvement in the storage capacity, when the memory capacity of the non-volatile memory 2 is more increased, the relevant non-volatile memory 2 increases in size of the X (row) decoder in proportion to the memory capacity. Namely, it becomes larger in size of the longer side.

The reason is that the number of address buses and word lines in the side of X decoder increases as the address area of memory is expanded. Meanwhile, the X (column) decoder side is provided for input and output of data bus and it does not change in size when the number of bits is not changed.

Accordingly, when the memory capacity of non-volatile memory 2 is expanded, about the left half of the semiconductor chip CH or more (about 50% or more of the area of the semiconductor chip CH) is occupied by the non-volatile memory 2.

Moreover, the oscillator 4 is arranged in the upper right side of the non-volatile memory 2, while the RAM 5 is provided in the right side of the oscillator 4. Moreover, the A/D•D/A converter 6 is arranged in the lower right side of the semiconductor chip CH and the power supply circuit 3 is arranged in the upper side of the A/D•D/A converter 6.

In the right side of the semiconductor chip CH, the logical unit 7 is arranged in the remaining internal circuit area. This logical unit 7 is formed of a CPU (Central Processing Unit), a timer, an interface such as SCI (Serial Communication Interface Unit), and various function modules of system control such as a bus controller.

Moreover, the bonding pads (electrodes) BP are arranged in the area near each side of the semiconductor chip CH and the I/O buffer 8 is arranged in the side of internal circuit area of these bonding pads BP. In other words, the bonding pads BP and I/O buffers 8 are arranged surrounding the internal circuit area in the external circumference of the semiconductor chip CH. Each bonding pad BP is respectively connected to the I/O buffer 8 via the wiring H.

This semiconductor chip CH is provided as described above with the bonding pads BP which are respectively arranged equally (in the same number) in the four sides.

Among the I/O buffers 8, the I/O buffers 8a and 8b connected to the bonding pads (corner electrodes) BPa and BPb respectively arranged at both ends portions in the two shorter sides of the semiconductor chip CH among a plurality bonding pads (electrodes) arranged in the two shorter sides are arranged in the longer sides of the semiconductor chip CH.

Therefore, the I/O buffers 8 are arranged in larger number in the longer sides than in the shorter sides of the semiconductor chip CH. For example, the n I/O buffers 8 are respectively arranged in the two longer sides, while the n−2 I/O buffers 8 are respectively arranged in the two shorter sides.

In the upper part of the I/O buffers 8 arranged in the area near the peripheral area of the semiconductor chip CH, the power supply wire DH is formed.

This power supply wire DH sequentially includes, from the external circumference of the semiconductor chip CH to the internal side, the reference potential power supply wire HSS for supplying the reference potential VSS, the power supply voltage wire HCC for supplying the power supply voltage VCC, and the step-down power supply wire HCL for supplying the step-down power supply VCL.

The power supply wire DH is a so-called surrounding power supply wire formed to surround the upper part of the I/O buffer 8 in the shape of a loop. Namely, the power supply wire DH is formed to surround, like the loop, the internal circuit area over the I/O buffer 8 arranged in the external circumference of the semiconductor chip CH.

FIG. 2 is a diagram illustrating an example of the layout of the I/O buffer 8 at the area near the corner of the semiconductor chip CH.

As illustrated in the figure, the I/O buffer 8a connected to the bonding pad BPa arranged at both end portions in the shorter sides of the semiconductor chip CH is arranged by being shifted to the longer sides of the semiconductor chip CH. Accordingly, the bonding pad BPa connected to the relevant I/O buffer 8a is arranged by being shifted to the area near the corner of the semiconductor chip CH.

In FIG. 2, the bonding pad BPa connected to the I/O buffer 8a is arranged by being shifted to the area near the corner of the semiconductor chip CH. However, as illustrated in FIG. 1, it is also possible that the bonding pad BPa is not shifted to the area near the corner of the semiconductor CH but is arranged in the area near the other bonding pad PBa arranged in the direction of shorter side of the semiconductor chip CH. In this case, an interval between the bonding pad BPa and adjacent bonding pad BP is set to become wider than the interval between the other bonding pads BP. Moreover, the bonding pad BPa may be arranged in the equal interval to the other bonding pad BP arranged in the direction of shorter side of the semiconductor chip CH.

Figure 12:
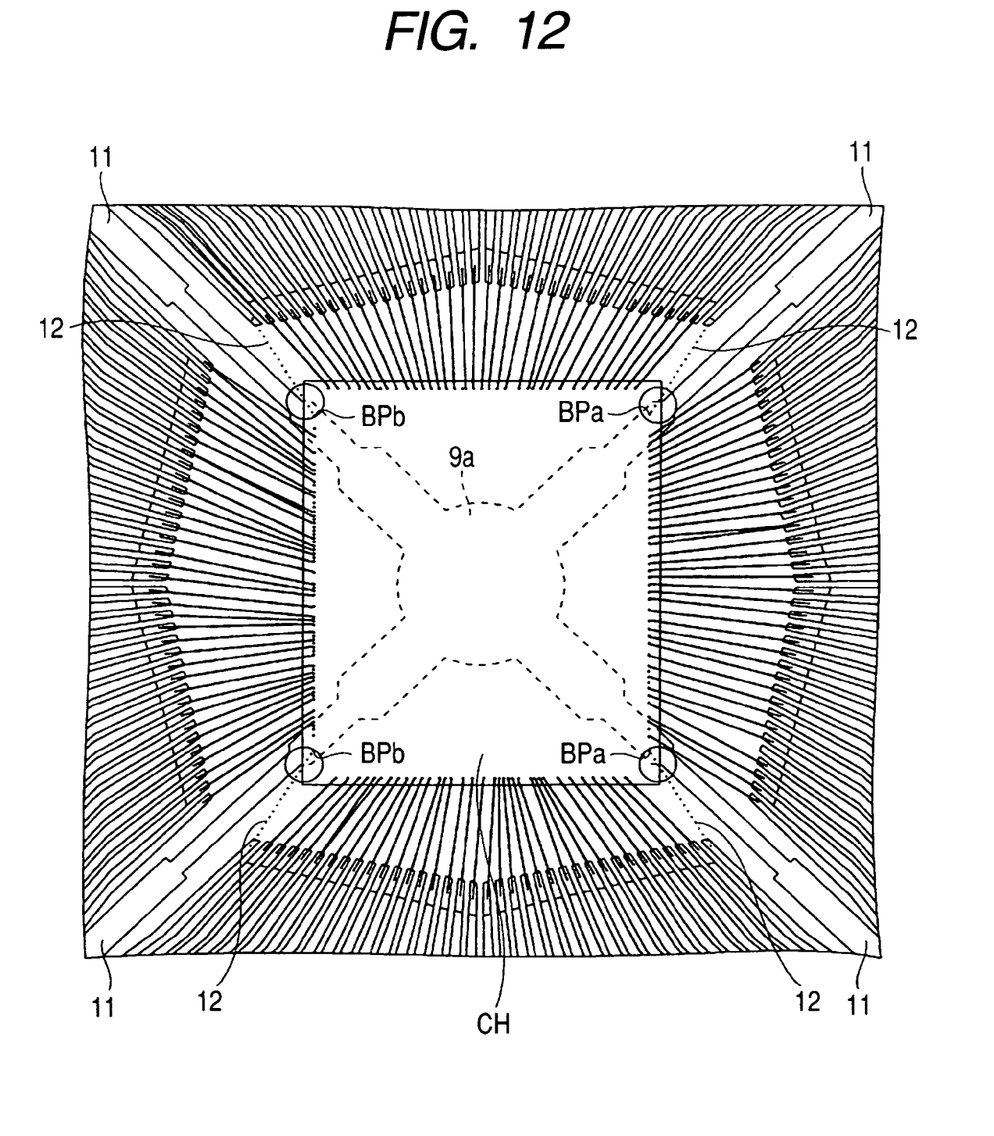
FIG. 12 is an explanatory diagram illustrating a verification example of the bonding pads discussed by the inventors of the present invention.

Here, the arrangement where the bonding pad PBa or BPb is provided in the direction of longer side of the semiconductor chip CH as illustrated in FIG. 12 will be verified. In this case, if the sealing is made under the condition described above, poor contact may be generated because the bonding wire 12 connected to the bonding pad BPa or BPb crosses a die pad suspending lead 11. However, in this embodiment, since the bonding pad BPa or BPb is arranged in the shorter side of the semiconductor chip CH, such poor contact can be prevented. Namely, reliability of semiconductor device can be improved.

FIG. 3 is a cross-sectional view along the line A–A' in the semiconductor chip CH.

In FIG. 3, the wiring structure of the step-down power supply wire HCL, power supply voltage wire HCC, reference potential power supply wire HSS, and wire H are respectively illustrated from the left side to the right side.

In the wiring structure, an interlayer insulation film ZM1 is formed via an element separating area SB formed over a semiconductor substrate SUB as illustrated, and a metal wiring layer M2 is also formed over the interlayer insulation film ZM1.

A metal wiring layer M3 is formed over the metal wiring layer M2 via an interlayer insulation film ZM3. The metal wiring layer M3 serves as an uppermost wiring layer.

The metal wiring layer M3 and the metal wiring layer M2 are electrically connected with a conductive film formed in a connecting hole. The metal wiring layers M2, M3 are formed of a metal film.

In this case, in the wiring structures of the step-down power supply wire HCL, power supply voltage wire HCC and reference potential power supply wire HSS, the metal wiring layers M2, M3 are used and the wire H is used only in the metal wiring layer M3 as the uppermost wiring layer.

FIG. 4 is an enlarged explanatory diagram of the corner part of the chip CH when the same number of the I/O buffers 31 and bonding pads 32 are respectively provided in the longer sides and shorter sides of the semiconductor chip 30 discussed by the inventors of the present invention.

As illustrated in FIG. 4, when the same number of I/O buffers 31 and bonding pads 32 are respectively arranged in the the longer sides and shorter sides of the semiconductor chip 30, the I/O buffer 31 arranged at the end part of each side is arranged up to the area near the corner of the semiconductor chip 30.

When the power supply wire 33 is wired as the surrounding power supply, a detour is necessary so that the bending portion of the power supply wire 33 is not wired over the I/O buffer 31 at the area near the corner. However, in actual, the number of wires of the power supply wire 33 is large (for example, about 10 to 20 wires) and it is difficult to provide a detour (indicated by the circular marks). Namely, the processes for the power supply wire 33 are complicated and moreover delay of signal due to the wiring resistance resulting from the detour becomes a problem.

In addition, a problem also rises depending on the length of the shorter side of the semiconductor chip 30 that it is impossible to realize the layout because the I/O buffer 31 to be arranged in the shorter sides cannot be accommodated.

Meanwhile, in the case of layout of the I/O buffer illustrated in FIG. 1, the I/O buffers 8 in the shorter sides can be arranged within the semiconductor chip CH with leeway because the number of I/O buffers 8 on the shorter sides is less than the number of I/O buffer on the longer sides.

Moreover, since the bending portion of the power supply wire DH can be wired not over the I/O buffer 8, the detour of the power supply wire DH is no longer required and effective layout can be designed.

In addition, the power supply wire 33 can also be processed easily and delay of signal by the wiring resistance can also be prevented.

FIG. 5 is an explanatory diagram of the bonding wire in the semiconductor chip CH loaded in the semiconductor device forming area 9 in a lead frame.

The lead frame is formed of a metal ribbon to which several or more square semiconductor device forming areas 9 are coupled. The semiconductor device forming area 9 is formed of a die pad 9a, a plurality of leads 10, and a die pad suspending lead 11 or the like.

As illustrated in the figure, the semiconductor chip CH is bonded and fixed over the die pad 9a located at the center of the semiconductor device forming area 9 in the lead frame via a bonding material such as the silver paste bonding material. In the area near the peripheral part of the semiconductor chip CH, a plurality of leads 10 are located.

Moreover, the die pad 9a is fixed with the die pad suspending lead 11 provided at the corner of the die pad 9a.

The end portions of a plurality of leads 10 and the bonding pad BP (FIG. 1) formed over the semiconductor chip CH are electrically connected with the bonding wire 12 formed of a gold lead.

In FIG. 5, the circular marks given to the areas near each corner of the semiconductor chip CH designate the bonding pads BPa, BPb respectively connected to the I/O buffers 8a, 8b. As described above, the optimum wire length can be maintained and contact with the die pad suspending lead 11 can also be prevented in the bonding wire 12 connected with the bonding pads BPa, BPb. Accordingly, a bonding rule can sufficiently be satisfied even when the rectangular semiconductor chip CH is loaded to the square semiconductor device forming area 9.

FIGS. 6A and 6B are external views of a TQFP type semiconductor device 1 which has been formed by resin sealing of the semiconductor device forming area 9 of FIG. 5.

In the TQFP type semiconductor device 1, the semiconductor chip CH, lead of semiconductor device forming area 9 and bonding wire 12 are sealed with a sealing resin 13 and a square package of about 16 mm×16 mm, for example, can be formed.

A plurality of leads 10 are projected from the package formed of the sealed resin 13 and the leads 10 are bent in the shape of crank as illustrated in FIG. 6B. A plurality of leads 10 projected from the sealed resin 13 are provided in the identical number in each side of the sealed resin 13.

According to the present embodiment as described above, when the semiconductor chip is formed in the rectangular shape, the semiconductor chip CH can be formed into the device of the square package without unnecessary increase in the size. Namely, the chip size of semiconductor device can be reduced. Thereby, since poor contact due to the cross of the binding wire 12 and die pad suspending lead 11 can be prevented, the reliability of the semiconductor device can be improved.

Moreover, in this embodiment, a non-volatile memory module is formed in the capacity of 1 Mbyte. However, the present invention can naturally be adapted even when the non-volatile memory module having the capacity larger than 1 Mbyte is used and the similar effect can also be attained in this case.

In addition, in this embodiment, the semiconductor device including the non-volatile memory module has been described but the present invention is not limited thereto. Namely, the present invention can also be adapted when the semiconductor chip CH is formed in the rectangular shape and the similar effect can also be attained in this case.

(Second Embodiment)

In the first embodiment, the TQFP type semiconductor device 1, which is formed by resin sealing of the semiconductor device forming area 9, has been described, but this second embodiment describes mounting of the semiconductor chip over the printed circuit board 14 where the square P-TFBGA is formed.

Figure 7:
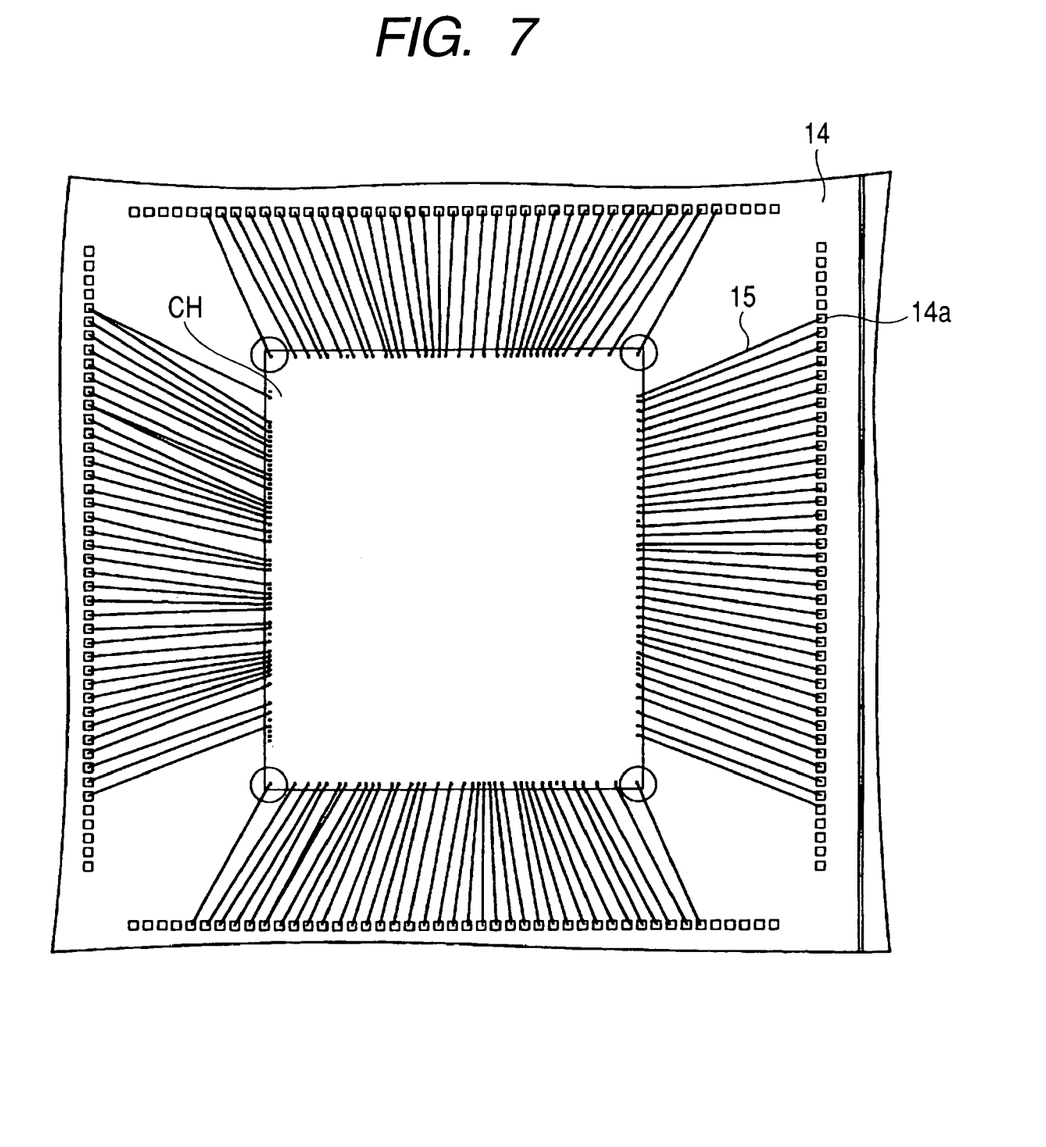
FIG. 7 is an explanatory diagram illustrating another example of the wiring of bonding wires in the semiconductor chip of FIG. 1.

FIG. 7 is an explanatory diagram of bonding wires in the semiconductor chip CH mounted on the printed circuit board 14 where the square P-TFBGA is formed.

At the center of the main surface of the printed circuit board 14, the semiconductor chip CH is bonded via the bonding material such as die bonding sheet. A bonding electrode 14a is formed in the area near the external circumference of the printed circuit board 14.

The bonding pad BP formed over the semiconductor chip CH and the bonding electrode 14a of the printed circuit board 14 are respectively bonded with a bonding wire 15 formed of the gold wire or the like.

At the rear surface of the printed circuit board 14, an electrode for bump or the like is formed, and the bonding electrode 14a and bump electrode are electrically connected to each other via the wiring pattern and through-hole.

In FIG. 7, the circular mark given to the area near each corner of the semiconductor chip CH respectively indicates the bonding pads BPa, BPb connected to the I/O buffers 8a, 8b. In this case, the bonding rule is sufficiently satisfied.

FIGS. 8A to 8D are external views of the P-TFBGA type semiconductor device formed by resin sealing of the printed circuit board of FIG. 7.

Figure 8A:
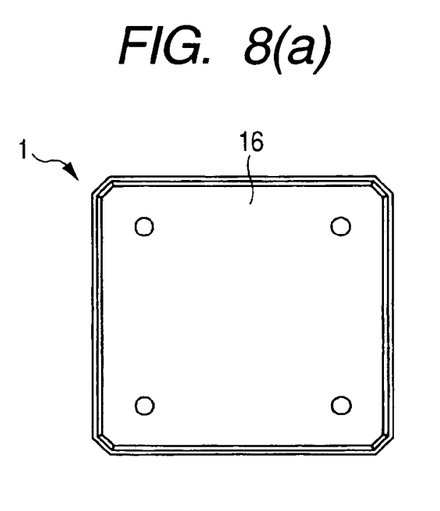
FIGS. 8A to 8D are external views illustrating another example of the semiconductor device formed by using the semiconductor chip of FIG. 1.
Figure 8B:
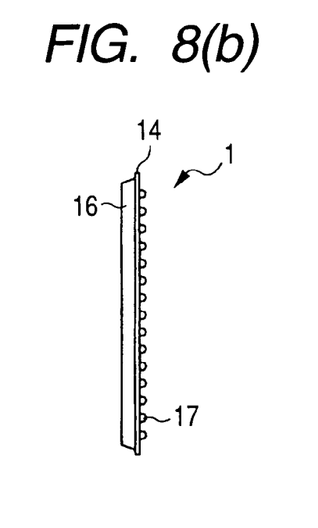

As illustrated in FIGS. 8A and 8B, the P-TFBGA type semiconductor device 1 is formed by sealing the semiconductor chip CH, bonding wire 15, bonding electrode 14a and the periphery thereof mounted over the printed circuit board 14 (FIG. 7) with the sealing resin 16. Accordingly, for example, the square package of about 13 mm×13 mm can be formed.

Figure 8C:
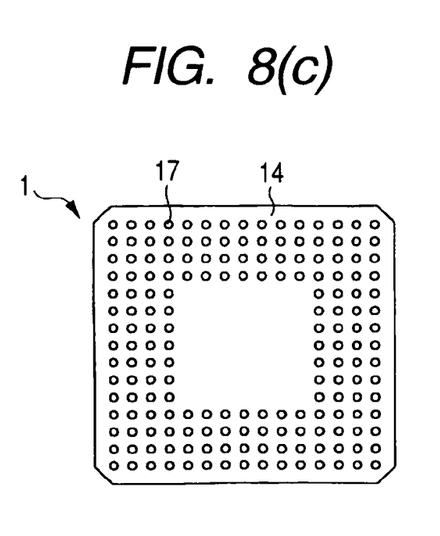
Figure 8D:
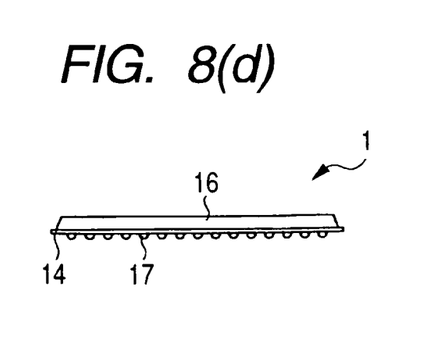

Moreover, a solder bump 17 formed of the spherical solder is respectively formed, as illustrated in FIGS. 8C and 8D, to the bump electrode formed at the rear surface of the printed circuit board 14. This solder bump 17 is used as the external connection terminal of the semiconductor device 1.

Therefore, according to this second embodiment, the semiconductor device 1 of square package can be formed without increase in the chip size of rectangular semiconductor chip CH.

(Third Embodiment)

In the first embodiment, the (n−2) I/O buffers are arranged in the two shorter sides of the semiconductor chip CH, while the n I/O buffers in the longer sides of the semiconductor chip CH. However, in the third embodiment, the I/O buffers less than (n−2) are arranged in the two shorter sides of the semiconductor chip CH.

Figure 9:
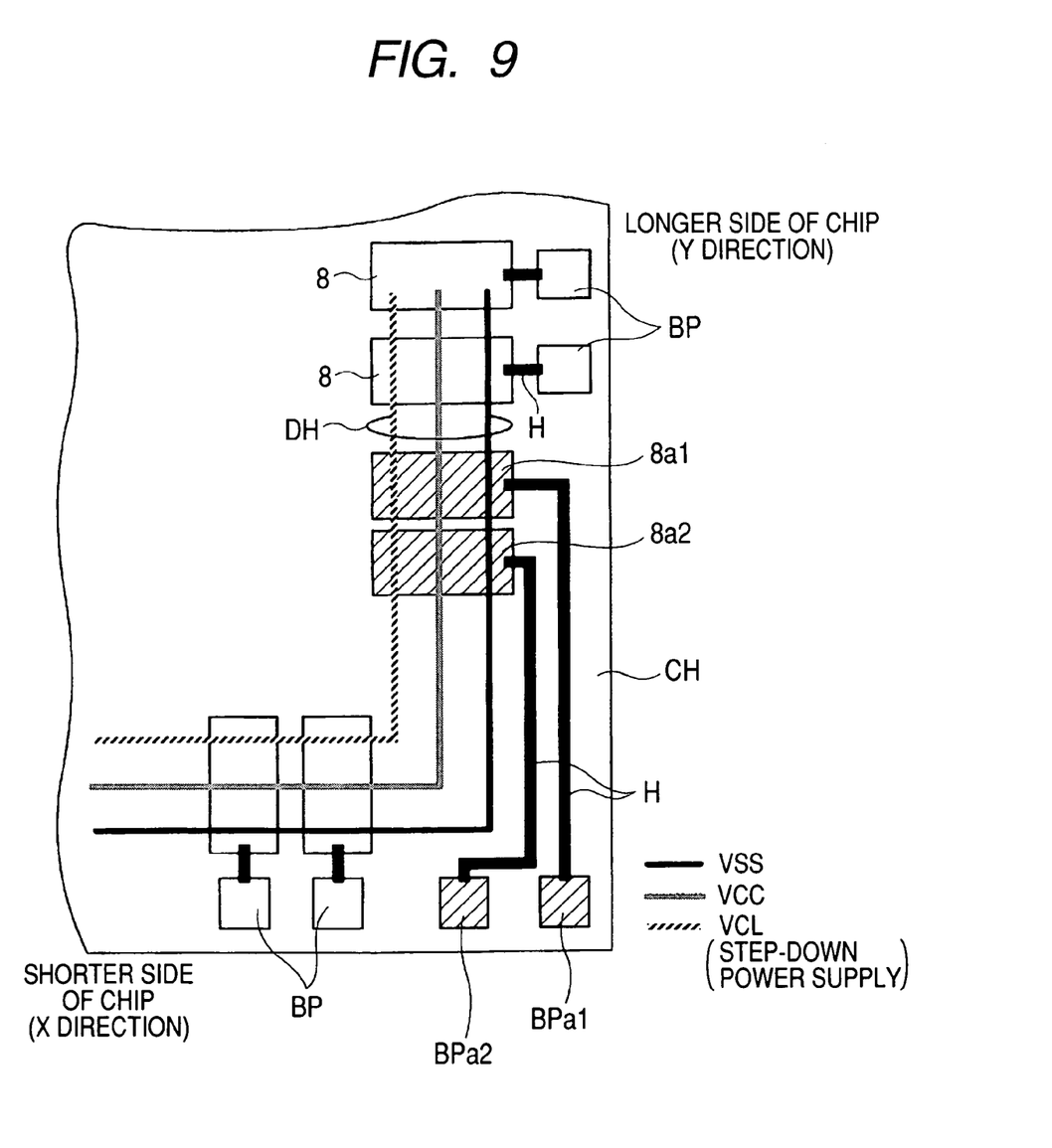
FIG. 9 is an explanatory diagram illustrating an example of a layout of the I/O buffers in the semiconductor chip based on another embodiment of the present invention.

FIG. 9 is an enlarged explanatory diagram of a certain corner of the semiconductor chip CH when the (n−4) I/O buffers are arranged in the two shorter sides of the semiconductor chip CH.

The I/O buffers 8a1, 8a2 connected to the bonding pads (electrode, corner) BPa1, BPa2 arranged at both end portions in the shorter sides of the semiconductor chip CH are arranged in the longer sides of the semiconductor chip CH.

Accordingly, the bonding pads BPa1, BPa2 connected to the I/O buffers 8a1, 8a2 are shifted and arranged in the area near the corner of the semiconductor chip CH, and are connected via the wire H. In this case, it is also possible that the bonding pads BPa1, BPa2 are not shifted to the area near the corner of the semiconductor chip CH and these may be arranged in the equal interval to the other bonding pads BP arranged in the shorter sides of the semiconductor chip CH.

The effect similar to that of the first embodiment described above can be attained by arranging the bonding pads BPa1, BPa2 as described above.

Accordingly, moreover, a larger space can be formed at the corner of the semiconductor chip CH and the wiring layout of the power supply wire DH can be formed easily. In addition, the poor contact due to the cross of the lead 10 connected to the bonding pad PBa or BPb and the die pad suspending lead 11 can also be prevented.

FIG. 9 illustrates only a certain corner area in the semiconductor chip CH. However, the I/O buffer arranged in the area near the other three corners in the shorter sides of the semiconductor chip CH are also shifted to the longer sides.

Moreover, the semiconductor device 1 in this third embodiment can also be adapted to the second embodiment described above and the similar effect can also be attained in this case.

(Fourth Embodiment)

The semiconductor chip described in the first embodiment to the third embodiment has been adapted to a single chip microcomputer but this semiconductor chip can also be adapted to the semiconductor device of the stacked structure where two semiconductor chips are stacked.

Figure 10:
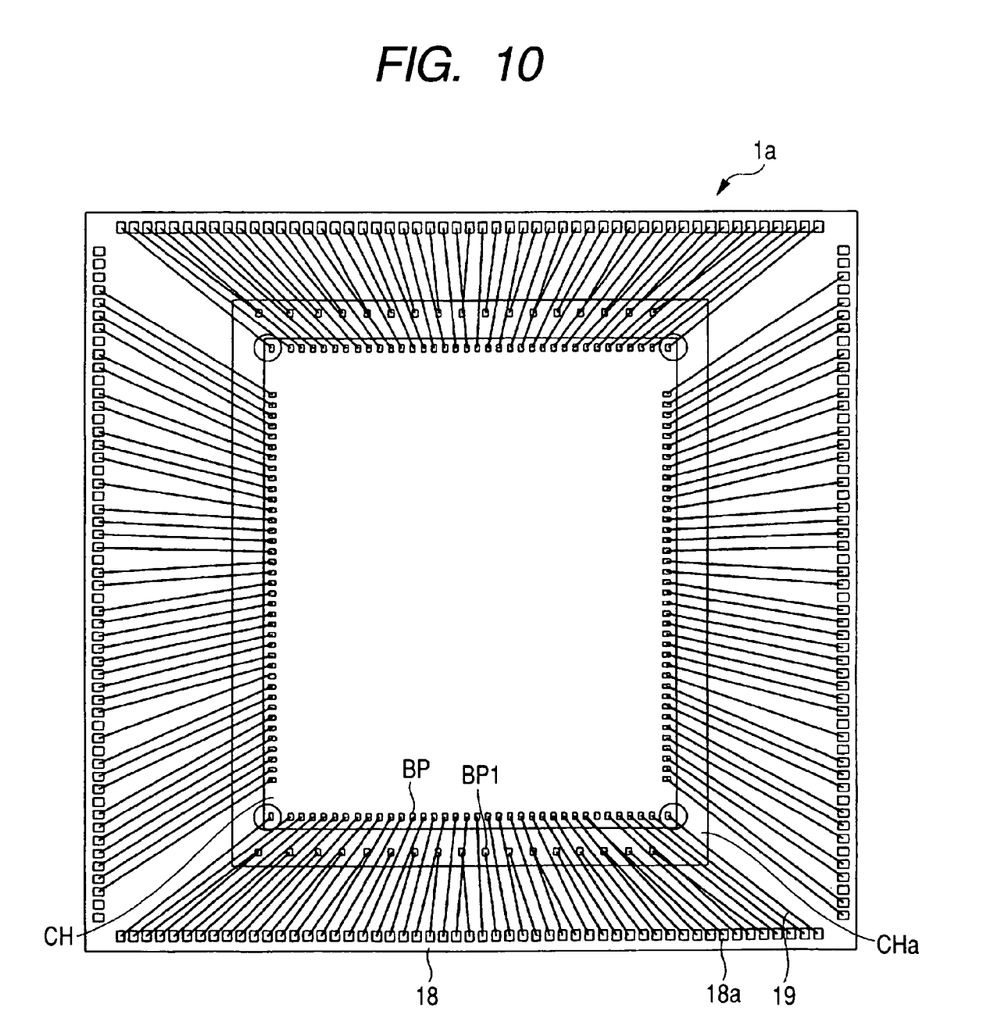
FIG. 10 is an explanatory diagram illustrating an example of wiring of the bonding wires in the semiconductor chip based on another embodiment of the present invention.
Figure 11:
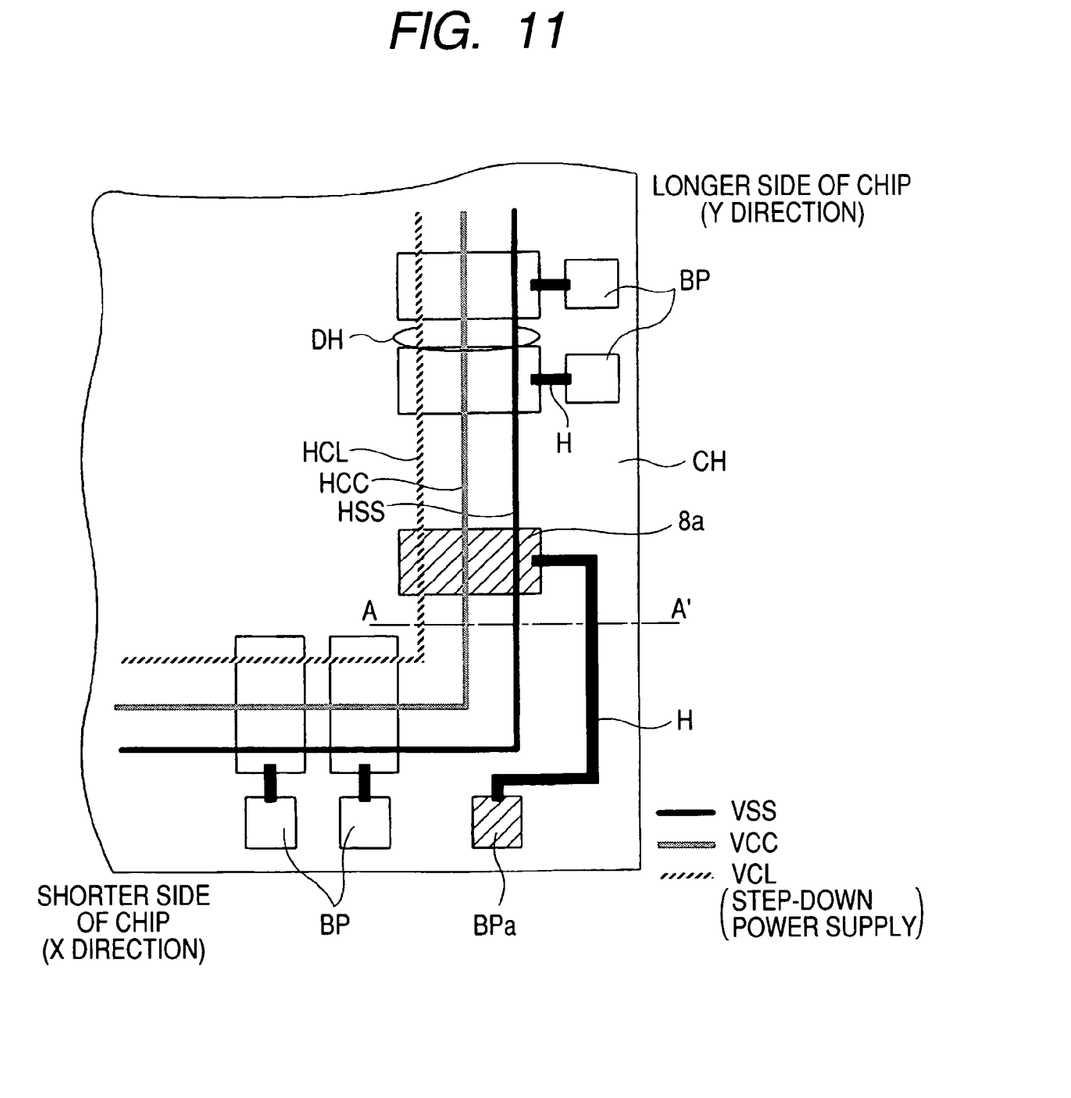
FIG. 11 is an enlarged explanatory diagram illustrating another example of the area near the corner based on another embodiment of the present invention.

FIG. 10 is an explanatory diagram of the bonding wires when the semiconductor device 1a of the stacked structure is constructed using the semiconductor chip CH described in the above embodiments.

In this case, the semiconductor chip CHa is mounted, via a bonding agent such as insulation resin, at the center of the printed circuit board 18 formed of a glass basic material. In this semiconductor chip CHa, the semiconductor chip CH is stacked and is then bonded and fixed also via a bonding agent such as the insulation resin.

Here, the semiconductor chip CH has the structure that the number of I/O buffers arranged are different in the longer sides and the shorter sides illustrated in the embodiments described above.

In the main surface of the printed circuit board 18, the bonding electrode 18a and wiring pattern are formed in the area near the external circumference of the printed circuit board 18. The bonding pad 18a and the bonding pads BP, BP1 provided in the area near the external circumference of the semiconductor chips CH, CHa are respectively connected via the bonding wire 19.

Moreover, at the rear surface of the printed circuit board 18, the connection electrodes arranged in the form of array and wiring pattern are formed. The solder bumps formed of the spherical solder are formed for the connection electrodes.

When the bonding is performed using the bonding wire 19, the semiconductor chips CH, CHa, periphery of bonding electrode 18a of the printed circuit board 18 and the bonding wire 19 are sealed with the sealing resin and thereby the square package can be formed.

As described above, the effects similar to that of the first embodiment can also be attained even when the present invention is adapted to the stacked structure where two semiconductor chips are stacked.

Moreover, the similar effects can also be obtained even by utilizing the semiconductor chip CH described in the third embodiment.

The present invention invented by the inventors has been described above but the present invention is not restricted by the embodiments described above and may be changed or modified in various manners within the scope of the subject matter thereof.

What is claimed is:

1. A semiconductor device comprising:
   a rectangular shape semiconductor chip,
   wherein said semiconductor chip includes:
      first electrodes arranged along longer sides of said semiconductor chip at a peripheral portion of said semiconductor chip;
      second electrodes arranged along shorter sides of said semiconductor chip at the peripheral portion of said semiconductor chip;
      first I/O buffers arranged along the longer sides of said semiconductor chip inwardly from said first electrodes; and
      second I/O buffers arranged along the shorter sides of said semiconductor chip inwardly from said second electrodes;
   wherein the number of said first I/O buffers is larger than the number of said second I/O buffers,
   wherein a plurality of said first electrodes are electrically connected to a plurality of said first I/O buffers, and
   wherein one of said second electrodes is electrically connected to one of said first I/O buffers, and another of said second electrodes is electrically connected to one of said second I/O buffers.

2. The semiconductor device according to claim 1,
   wherein said one of said second electrodes is formed as a corner electrode arranged in a corner of said semiconductor chip.

3. The semiconductor device according to claim 2,
   wherein said corner electrode is connected to said one of said first I/O buffers via a wire having an L-shape flat surface.

4. The semiconductor device according to claim 2,
   wherein a distance between said corner electrode and an electrode adjacent to said corner electrode is longer than other distances between adjacent second electrodes.

5. The semiconductor device according to claim 4,
   wherein a plurality of power supply wires are formed along said longer sides and said shorter sides of said semiconductor chip above said first and second I/O buffers, and
   wherein said plurality of power supply wires are wired in parallel in a flat surface direction of said semiconductor chip.

6. The semiconductor device according to claim 1,
   wherein the number of said first electrodes is identical to the number of said second electrodes.

7. The semiconductor device according to claim 1,
   wherein a non-volatile memory module is arranged in at least 50% of an area of said semiconductor chip.

8. The semiconductor device according to claim 7,
   wherein said non-volatile memory module is formed in a rectangular shape, and longer sides of said non-volatile memory module are arranged to extend along said longer sides of said semiconductor chip.

9. The semiconductor device according to claim 7,
   wherein said non-volatile memory module is a flash memory module.

10. The semiconductor device according to claim 1,
    wherein a semiconductor device forming area is formed between a plurality of leads projected from four sides of lead frame portion formed in a square shape.

11. The semiconductor device according to claim 1,
    wherein a distance between said one of said second electrodes and an electrode adjacent to one of said second electrodes is longer than other distances between adjacent second electrodes.

12. The semiconductor device according to claim 1,
    wherein said first and second I/O buffers include an ESD protection circuit.

13. A semiconductor device, comprising:
    a semiconductor chip having longer sides and shorter sides;
    a lead frame having first leads arranged along said longer sides of said semiconductor chip and second leads arranged along said shorter sides of said semiconductor chip;
    wherein said semiconductor chip includes:
       a non-volatile memory module,
       first bonding pads arranged along said longer sides of said semiconductor chip at a peripheral portion of said semiconductor chip,
       second bonding pads arranged along said shorter sides of said semiconductor chip at the peripheral portion of said semiconductor chip,
       first I/O buffers arranged along said longer sides of said semiconductor chip inwardly from said first bonding pads,
       second I/O buffers arranged along said shorter sides of said semiconductor chip inwardly from said second bonding pads,
       wherein the number of said first I/O buffers is larger than the number of said second I/O buffers, wherein said first bonding pads are connected to said first leads by first bonding wires, wherein said second bonding pads are connected to said second leads by second bonding wires, wherein a plurality of said first bonding pads are electrically connected to a plurality of said, first I/O buffers, and wherein one of said second bonding pads is electrically connected to one of said first I/O buffers, and another of said second bonding pads is electrically connected to one of said second I/O buffers.

14. The semiconductor device according to claim 13, wherein said first and second I/O buffers include an ESD protection circuit.

15. The semiconductor device according to claim 13, wherein said non-volatile memory module is a flash memory module.

16. The semiconductor device according to claim 13, wherein the number of said first bonding pads is identical to the number of said second bonding pads.

17. The semiconductor device according to claim 13, wherein said one of said second bonding pads is formed as a corner bonding pad arranged in a corner of said semiconductor chip.

18. The semiconductor device according to claim 17, wherein said corner bonding pad is connected to said one of said first I/O buffers via a wire having an L-shape flat surface.

19. The semiconductor device according to claim 13, wherein said one of said second bonding pads is an end bonding pad of said second bonding pads.

20. The semiconductor device according to claim 19, wherein said one of said second bonding pads is connected to said one of said first I/O buffers via a wire having an L-shape flat surface.

21. The semiconductor device according to claim 13, wherein power supply wires are arranged along said longer sides and said shorter sides of said semiconductor chip above said first and second I/O buffers.

22. The semiconductor device according to claim 13, wherein said non-volatile memory module is arranged in 50% or more of an area of said semiconductor chip.

23. The semiconductor device according to claim 13, wherein a distance between said one of said second bonding pads and a bonding pad adjacent thereto is greater than other distances between adjacent second bonding pads.

24. The semiconductor device according to claim 13, wherein a die pad is suspended inwardly from said first leads and said second leads.

25. The semiconductor device according to claim 24, wherein said semiconductor chip is mounted over said die pad.

26. The semiconductor device according to claim 13, wherein said semiconductor device is sealed by a resin such that said first leads and said second leads project from said resin.

27. The semiconductor device according to claim 13, wherein a shape of said semiconductor chip is rectangular, and wherein a shape of said semiconductor device is square.

* * * * *